US012512303B2

(12) United States Patent
Gnanaprakasa et al.

(10) Patent No.: US 12,512,303 B2
(45) Date of Patent: Dec. 30, 2025

(54) SOFT-CHUCKING SCHEME FOR IMPROVED BACKSIDE PARTICLE PERFORMANCE

(71) Applicant: Applied Materials, Inc., Santa Clara, CA (US)

(72) Inventors: Tony Jefferson Gnanaprakasa, Mountain View, CA (US); Alvaro Garcia, Mountain View, CA (US); Gautham Bammanahalli, Santa Clara, CA (US); Tatsuichiro Inoue, Santa Clara, CA (US); Nathaniel Moore, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 132 days.

(21) Appl. No.: 18/372,818

(22) Filed: Sep. 26, 2023

(65) Prior Publication Data

US 2024/0112939 A1    Apr. 4, 2024

Related U.S. Application Data

(60) Provisional application No. 63/412,271, filed on Sep. 30, 2022.

(51) Int. Cl.
*H01T 23/00* (2006.01)
*H01J 37/32* (2006.01)
(Continued)

(52) U.S. Cl.
CPC .... *H01J 37/3244* (2013.01); *H01J 37/32715* (2013.01); *H01L 21/67069* (2013.01);
(Continued)

(58) Field of Classification Search
None
See application file for complete search history.

(56) References Cited

U.S. PATENT DOCUMENTS 5,684,669 A * 11/1997 Collins ............... H02N 13/00
361/234
6,606,234 B1   8/2003 Divakar
(Continued)

FOREIGN PATENT DOCUMENTS

CN         112908919 A    6/2021
JP       2019212910 A   12/2019
(Continued)

OTHER PUBLICATIONS

International Search Report and Written Opinion Dated Feb. 29, 2024 re PCT Application No. PCT/US2023/033677.
(Continued)

*Primary Examiner* — Stephen W Jackson
(74) *Attorney, Agent, or Firm* — Patterson + Sheridan, LLP

(57) ABSTRACT

Embodiments of this disclosure include methods of chucking and de-chucking a substrate. A method of chucking a substrate to a surface of an electrostatic chuck includes applying a first voltage to a chucking electrode in the ESC during a chucking time interval, supplying an inert gas at a first pressure to a backside of the substrate during the chucking time interval, applying a second voltage to the chucking electrode in the ESC after the chucking time interval, the second voltage being higher than the first voltage, and supplying the inert gas at a second pressure to the backside of the substrate after the chucking time interval, the second pressure being higher than the first pressure of the inert gas.

19 Claims, 4 Drawing Sheets

(51) Int. Cl.
*H01L 21/67* (2006.01)
*H01L 21/683* (2006.01)

(52) U.S. Cl.
CPC ...... *H01L 21/6831* (2013.01); *H01L 21/6833* (2013.01); *H01J 2237/002* (2013.01); *H01J 2237/007* (2013.01)

(56) References Cited

U.S. PATENT DOCUMENTS

| | | | |
|---|---|---|---|
| 2010/0254063 A1* | 10/2010 | Sheng | H01L 21/6833 118/723 R |
| 2017/0352568 A1 | 12/2017 | Cho et al. | |
| 2019/0206712 A1* | 7/2019 | Boyd, Jr. | H01J 37/32715 |
| 2020/0328063 A1* | 10/2020 | Bobek | H01J 37/32743 |
| 2020/0357675 A1* | 11/2020 | Noorbakhsh | H01L 21/67069 |
| 2020/0365441 A1* | 11/2020 | Hu | H01L 21/68757 |
| 2022/0172975 A1 | 6/2022 | Prouty et al. | |

FOREIGN PATENT DOCUMENTS

| | | |
|---|---|---|
| JP | 2020035886 A | 3/2020 |
| KR | 20210080593 A | 6/2021 |
| KR | 20210158874 A | 12/2021 |

OTHER PUBLICATIONS

Korean Office Action for Application No. 10-2025-7013418 dated Sep. 11, 2025.

\* cited by examiner

SOFT-CHUCKING SCHEME FOR IMPROVED BACKSIDE PARTICLE PERFORMANCE

CROSS-REFERENCE TO RELATED APPLICATIONS

This application claims benefit of U.S. Provisional Patent Application No. 63/412,271, filed on Sep. 30, 2022, the entirety of which is herein incorporated by reference.

BACKGROUND

Field

In semiconductor processing, a plasma process is often performed in vacuum by evacuating gas from a processing chamber. In such a process, a substrate is placed on an electrostatic chuck (ESC) that is arranged on a stage of a processing chamber. The electrostatic chuck includes a conductive sheet-type chucking electrode that is arranged between dielectric members (e.g., dielectric layers).

When performing a plasma process, a voltage from a direct current voltage source is applied from the voltage source to the chucking electrode so that the substrate is "chucked" to a surface of the electrostatic chuck by a Coulombic or Johnson-Rahbek force generated from the voltage application. After the plasma process is completed, the voltage applied to the chucking electrode of the electrostatic chuck is typically turned off or set to a low value to compensate for any residual charge left on the wafer so that the substrate may be dechucked from the electrostatic chuck.

In some instances, to dechuck the substrate, a discharge process is performed, which involves introducing inert gas into the processing chamber to maintain the pressure within the processing chamber at a predetermined pressure level, applying a voltage of the opposite polarity with respect to the voltage applied to the electrostatic chuck during the plasma process, and then turning off or setting to a low value to compensate for any residual charge left on the wafer the voltage application so that the electric charges of the electrostatic chuck and the substrate may be discharged. Then, support pins are raised so that the substrate may be lifted and dechucked from the electrostatic chuck.

During the process of "chucking" a substrate, when a high voltage is applied to the chucking electrode to chuck the substrate to the ESC, the force generated onto the substrate from the sudden voltage application can be quite high. Moreover, as the temperature of the substrate equilibrates to match the temperature of the surface of the electrostatic chuck, the coefficient of thermal expansion (CTE) mismatch between the substrate and the surface of the electrostatic chuck causes relative motion between the backside of the substrate and the surface of the electrostatic chuck. The relative motion between the two components in turn causes a relative sliding motion, which, in turn, has been found to generate particles on the backside of the substrate, and/or cause scratches and damage to the backside surface of the substrate.

As such, there is a need for improved methods for reducing the harmful effects to a substrate when chucking and dechucking it from the ESC.

SUMMARY

In one embodiment, a method of chucking a substrate to a surface of an electrostatic chuck (ESC) is provided. The method includes applying a first voltage to a chucking electrode in the ESC during a chucking time interval, supplying an inert gas at a first pressure to a backside of the substrate during the chucking time interval, applying a second voltage to the chucking electrode after the chucking time interval, the second voltage being higher than the first voltage, and supplying the inert gas at a second pressure to the backside of the substrate after the chucking time interval, the second pressure being higher than the first pressure of the inert gas.

In another embodiment, a method of de-chucking a substrate from a surface of an electrostatic chuck (ESC) is provided. The method includes reducing a backside gas pressure at a lower surface of a substrate, reducing an applied voltage to a chucking electrode in the ESC to a dechucking voltage after reducing the pressure, increasing a substrate temperature for a dechucking interval, reducing backside gas pressure after the dechucking interval and reducing the dechucking voltage.

In another embodiment, a substrate processing chamber is provided. The chamber includes an electrostatic chuck (ESC) in fluid communication with a cryogenic chiller and a controller. The controller includes a central processing unit (CPU), support circuits, and a non-transitory computer readable medium. The computer readable medium includes instructions for chucking a substrate. When executed, the instructions cause, first voltage to be applied to a chucking electrode in the ESC for a first time interval, a first pressure of inert gas to be applied to a backside of the substrate for the first time interval, a second voltage to be applied to the chucking electrode for a second time interval after the first time interval, the second voltage being higher than the first voltage, and a second pressure of inert gas to be applied to the backside of the substrate for the second time interval, the second amount of inert gas being lower than the first amount of inert gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
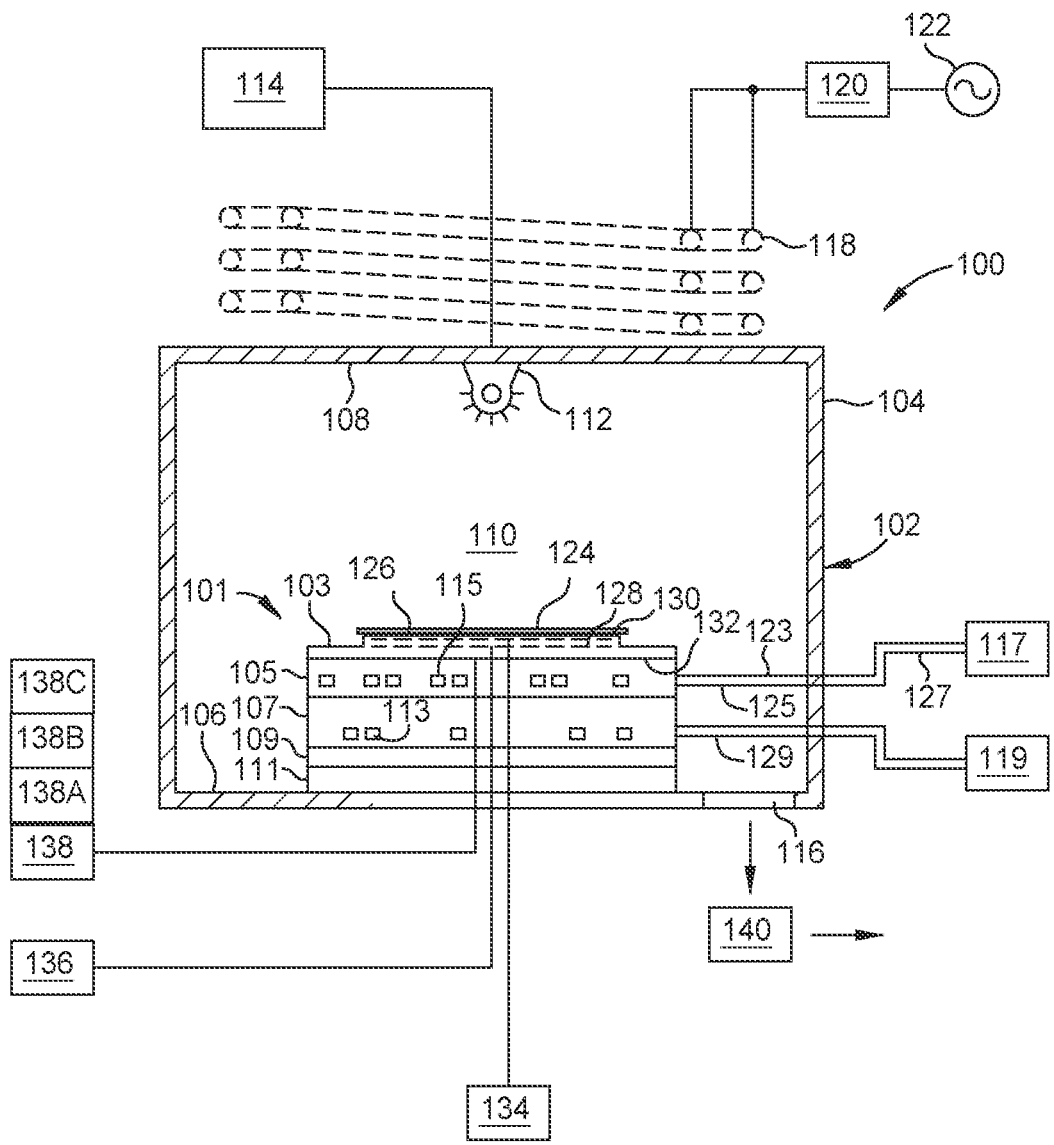
FIG. 1 illustrates a schematic cross-sectional view of a plasma processing chamber, according to an embodiment of the disclosure.

To minimize the harmful effects of the sudden high voltage application to chucking electrode that causes a high force to substrate, the present disclosure provides for a two-stage "soft" chucking process. That is, instead of applying the high voltage for chucking in a nearly instantaneous manner, the voltage is incremented in two stages, and is ramped from the lower set point to the higher set point. While exemplary embodiments discussed herein describe a two-stage chucking process, there may be three or more stages in other embodiments.

A rapid increase in chucking force may cause damage to the back side of a substrate. Generally, a substrate is initially at room temperature before processing. In some processes, a single moderate to relatively high chucking voltage, such as 2,000 V, is applied by an electrostatic chuck (ESC) which imparts a force to the substrate. During some processes the substrate temperature is reduced from room temperature to a value as low as −90° C. due to its contact with a cooled ESC. The substrate contracts radially because of the significant temperature drop experienced by the chucked substrate, an electrostatic chuck that is maintained at a cryogenic temperature (e.g., −90° C.). In some cases, the temperature of the substrate is not able to fully stabilize or equilibrate to the ESC temperature before the chucking process is completed and the subsequent substrate processing steps begin. This, in turn, can lead to damage to the substrate, and/or to the surface upon which the substrate sits, as well as an increased release of particles from the backside of the substrate.

However, the inventors have found that when a lower chucking voltage is applied in a first stage and the substrate temperature is allowed to stabilize or equilibrate before a higher chucking voltage is applied in a second stage, the lower chucking voltage and thus lower chucking force applied during the first stage to the substrate causes fewer particles to be generated on the backside of the substrate while the temperature of the substrate is being equilibrated during this first stage. Since a lower force is applied while temperature of the substrate is rapidly changing from room temperature to the electrostatic chuck temperature, the lower contact stress interaction between the backside of the substrate and the top surface of the electrostatic chuck minimizes the amount of physical damage to the substrate or the ESC surface upon which it sits.

The inventors have found that if a relatively low first stage chucking voltage, such as between about 700 V and about 900V is applied, temperature stabilization at between about −70° C. and about −100° C. is achieved in approximately 20 to about 30 seconds. Once the substrate temperature has stabilized, a higher second stage chucking voltage, such as between about 1,900 V and about 2,000 V can be applied to the chucking electrode to complete the chucking process and increase the thermal contact between the backside of the substrate and the top surface of the ESC. The relative motion between the backside of the substrate and the top surface of the electrostatic chuck due to thermal mismatch is small since the temperature difference between the backside of the substrate and the top surface of the electrostatic chuck during the second stage is relatively small. For example, the difference in temperature between the ESC and the substrate is less than 20° C., or less than 10° C., or less than 5° C. or even less than 3° C.

It should be understood that the specific voltages applied in each stage can be variable. For example, the first stage voltage may be a value other than 800 V and the second stage voltage may be a value other than 2,000 V in other embodiments.

Preliminary testing shows that use of the two-stage soft chucking process with a 25 second first stage interval has no measurable effect on the amount of Helium or Argon gas leaking from the backside of the substrate at a set backside gas pressure when compared to a single stage chucking process. As such, the use of a two-stage chucking process as discussed herein, compared to a single stage chucking process, does not cause any increase in backside gas leakage.

Results show an analysis of the number of particles released from the backside of the substrate in two embodiments. In a first embodiment, the backside gas applied to the substrate is Helium. For this embodiment, the number of particles greater than 2 micrometers decreases from about 30,000 for the baseline (or single stage) chucking process to about 19,000 for the two-stage chucking process when a time interval of 30 seconds was used for the first stage time length. This yields a ~34% reduction in the number of particles released from the backside of the substrate.

In a second embodiment, the backside gas applied to the substrate is Argon. For this embodiment, the number of particles greater than 2 micrometers decreases from about 30,000 for the baseline chucking process to about 5,000 for the two-stage chucking process with a time interval of 30 seconds was used for the first stage time length. This yields a ~83% reduction in the number of particles released from the backside of the substrate.

FIG. 1 illustrates a schematic cross-sectional view of an exemplary plasma process chamber 100, shown configured as an etch chamber, having a substrate support assembly 101. The substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface or work piece, such as a substrate 124, at temperatures less than about −20° C. is desirable. Dry reactive ion etching a substrate 124 may occur at various temperatures including at temperatures less than −20° C. or greater than 300° C. enables ions to bombard the upward facing surfaces of materials disposed on the substrate 124 with decreased spontaneous etching so that trenches with smooth, vertical sidewalls are formed. One of the many advantages of these techniques include an improved selectivity of etching one material versus another at temperatures less than −20° C. For example, selectivity between silicon (Si) and silicon dioxide ($SiO_2$) increases exponentially as temperature is decreased.

The plasma process chamber 100 includes a chamber body 102 having sidewalls 104, a bottom 106, and a lid 108 that enclose a process region 110. An injection apparatus 112 is coupled to the sidewalls 104 and/or lid 108 of the chamber body 102. A gas panel 114 is coupled to the injection apparatus 112 to enable delivery of process gases into the process region 110. The injection apparatus 112 may be one or more nozzle or inlet ports, or alternatively, a showerhead. Process gases, along with any processing by-products, are removed from the process region 110 through an exhaust port 116 formed in the sidewalls 104 or bottom 106 of the chamber body 102. The exhaust port 116 is coupled to a pump system 140, which includes throttle valves and pumps utilized to control the vacuum levels within the process region 110.

Process gases are energized to form a plasma within the process region 110. In one embodiment, process gases are energized by capacitively or inductively coupling RF power or pulsed DC to the process gases. In this embodiment, which can be combined with other embodiments described herein, depicted in FIG. 1, a plurality of coils 118 are disposed above the lid 108 of the plasma process chamber 100 and coupled through a matching circuit 120 to an RF power source 122.

The substrate support assembly 101 is disposed in the process region 110 below the injection apparatus 112. The substrate support assembly 101 includes an electrostatic chuck (ESC) 103 and an ESC base 105. The ESC base 105 is coupled to the ESC 103 and a facility plate 107. The facility plate 107 supported by a ground plate 111 is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111.

The ESC base 105 includes a base channel 115 coupled to a cryogenic chiller 117. The cryogenic chiller 117 is in fluid communication with the base channel 115 via a base inlet conduit 123 connected to an inlet of the base channel 115 and via a base outlet conduit 125 connected to an outlet of the base channel 115 such that the ESC base 105 is maintained at temperatures less than −20° C. The cryogenic chiller 117 is coupled to an interface box (not shown) to control a flow rate of a base fluid. The base fluid may include a material that can maintain a temperature less than −50° C. The cryogenic chiller 117 provides the base fluid, which is circulated through the base channel 115 of the ESC base 105. The base fluid flowing through the base channel 115 enables the ESC base 105 to be maintained at temperatures less than −20° C., which assists in controlling the lateral temperature profile of the ESC 103 so that a substrate 124 disposed on the ESC 103 is uniformly maintained at temperatures less than −20° C. or greater than 300° C. In one embodiment, which can be combined in other embodiments described herein, the cryogenic chiller 117 is a single-stage chiller operable to maintain the base fluid at temperature less than about −50° C. In another embodiment, which can be combined in other embodiments described herein, the cryogenic chiller 117 is a chiller that utilizes refrigerant internal to the chiller such that the base fluid is maintained at temperatures less than −50° C.

The facility plate 107 includes a facility channel 113 coupled to a chiller 119. The chiller 119 is in fluid communication with the facility plate 107 via a facility inlet conduit 129 such that the facility plate 107 is maintained at a predetermined ambient temperature. The cryogenic chiller 117 is coupled to an interface box to control a flow rate of the facility fluid. The facility fluid may include a material that can maintain an ambient temperature between about −10° C. to about 60° C. The chiller 119 provides the facility fluid, which is circulated through the facility plate 107. The facility fluid enables the facility plate 107 to be maintained at the predetermined ambient temperature, which assists in maintaining the insulator plate 109 at the predetermined ambient temperature.

The ESC 103 has a support surface 130 and a bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a monopolar or bipolar electrode, or other suitable arrangement. The chucking electrode 126 is coupled through an RF filter (not shown) and the facility plate 107 to a chucking power source 134, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to elevate the temperature, if desired, of the ESC 103 to the temperature suitable for processing a substrate 124 disposed on the support surface 130. The resistive heaters 128 are coupled through the facility plate 107 and an RF filter (not shown) to a heater power source 136. The RF filter prevents RF power utilized to form a plasma (not shown) within the plasma processing chamber 100 from damaging electrical equipment or presenting an electrical hazard outside the chamber. The heater power source 136 may include a heater controller (not shown) utilized to control the operation of the heater power source 136, which is generally set to heat the substrate 124 when needed in order to maintain the substrate temperature at a desired temperature. In other embodiments, the controller is separate from the heater power source 136. Stated differently, heat from the resistive heaters 128 and cooling from the base fluid circulating through the ESC base 105 are balanced to maintain the substrate 124 at a desired temperature at or under −20° C. For example, the resistive heaters 128 and the base fluid circulating through the ESC base 105 maintain the substrate 124 at a temperature suitable for processing that is less than about −20° C., such as between about −20° C. to about −150° C.

The resistive heaters 128 include a plurality of laterally separated heating zones, wherein the heater controller enables at least one zone of the resistive heaters 128 to be preferentially heated relative to the resistive heaters 128 located in one or more of the other zones. For example, the resistive heaters 128 may be arranged concentrically in a plurality of separated heating zones. The separated heating zones of the resistive heaters 128 assist controlling the lateral edge to center temperature uniformity of the substrate 124. The substrate support assembly 101 may also include one or more probes (not shown) disposed therein. The ESC 103 is coupled a controller 138. The probes disposed in the ESC base 105 are communicatively coupled to the controller 138 and may be utilized together to calibrate of the temperature of the substrate based on the temperature of the ESC base 105. The controller 138 is coupled to the heater power source 136 so that each zone of the resistive heaters 128 is independently heated for the lateral temperature profile of the ESC 103 to be substantially uniform based on temperature measurements so that a substrate 124 disposed on the ESC 103 is uniformly maintained at temperatures less than −20° C.

In some embodiments of the present disclosure, an apparatus for chucking and dechucking a substrate from a surface of an ESC in a processing chamber comprises a controller 138. The controller 138 includes a programmable central processing unit (CPU) 138A which is operable with a memory 138B (e.g., non-volatile memory) and support circuits 138C. The CPU 138A of the controller 138 includes one or more processors to execute instructions stored in the memory 138B to conduct a method to accomplish the two-stage soft chucking process. The support circuits 138C are conventionally coupled to the CPU 138A and comprise cache, clock circuits, input/output subsystems, power supplies, and the like, and combinations thereof coupled to the various components of the substrate processing chamber 100, to facilitate control thereof. The CPU 138A is one of any form of general purpose computer processor used in an industrial setting, such as a programmable logic controller (PLC), for controlling various components and sub-processors of the processing system. The memory 138B, coupled to the CPU 138A, is non-transitory computer readable medium and is typically one or more of readily available memories such as random access memory (RAM), read only memory (ROM), floppy disk drive, hard disk, or any other form of digital storage, local or remote.

Typically, the memory 138B is in the form of a non-transitory computer-readable storage media containing instructions (e.g., non-volatile memory), which when executed by the CPU 138A, facilitates the operation of the chamber 100. The instructions in the memory are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 138 may be used with one or any combination of the various modular polishing systems described herein and/or with the individual polishing modules thereof.

Figure 2:
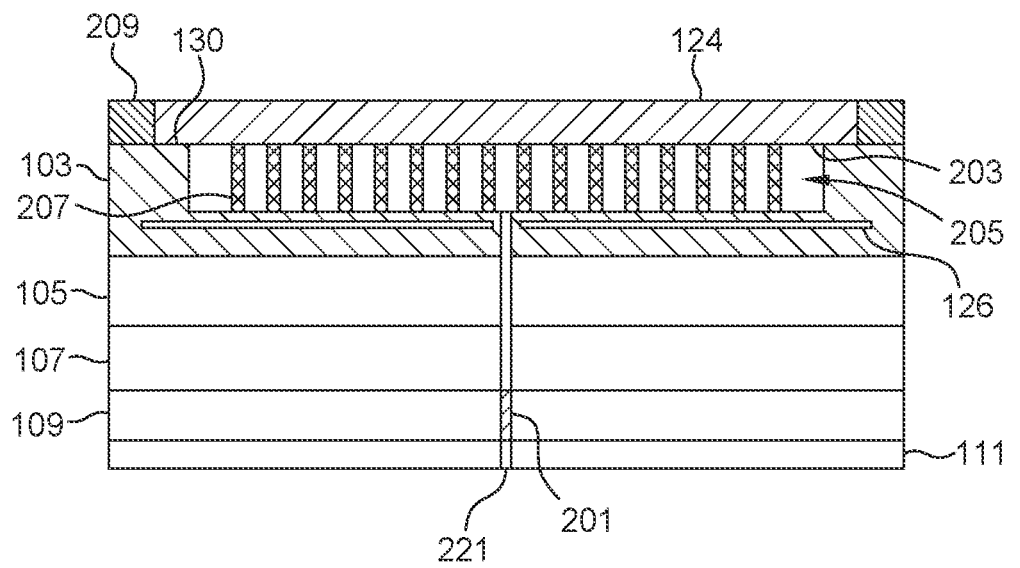
FIG. 2 illustrates a schematic cross-sectional view of a plasma processing chamber, according to an embodiment of the disclosure.

FIG. 2 illustrates an exemplary cross section of the substrate support assembly 101. The substrate support assembly 101 includes the ESC 103, ESC base 105, facility plate 107, insulator plate 109, ground plate 111, and an edge ring 209.

The chucking electrodes 126 within the ESC 103 provides chucking force when a voltage is applied to the chucking electrode and there is a voltage difference between the substrate 124 and the ESC chucking electrode 126. In order for there to be chucking force, the substrate lower surface 203 needs to be in contact with the ESC support surface 130.

The support surface 130 includes the top surface of the ESC 103 and the tops of a plurality of posts 207 disposed within a backside gas cavity 205 of the ESC 103. The cavity 205 may be sealed or partially sealed from the processing region 110 (FIG. 1) by the support surface 130 and substrate lower surface 203 when chucked via the chucking electrode 126.

The backside gas cavity may be supplied and have gas exhausted through a backside gas conduit 221. When the cavity 205 is filled with a backside gas it further aids thermal energy transfer between the ESC 103 and the substrate 124. The backside gas supplied by the backside gas conduit passes through a porous plug 201. In some embodiments the porous plug is disposed in the insulator plate 109.

Algorithmic Control

Figure 3:
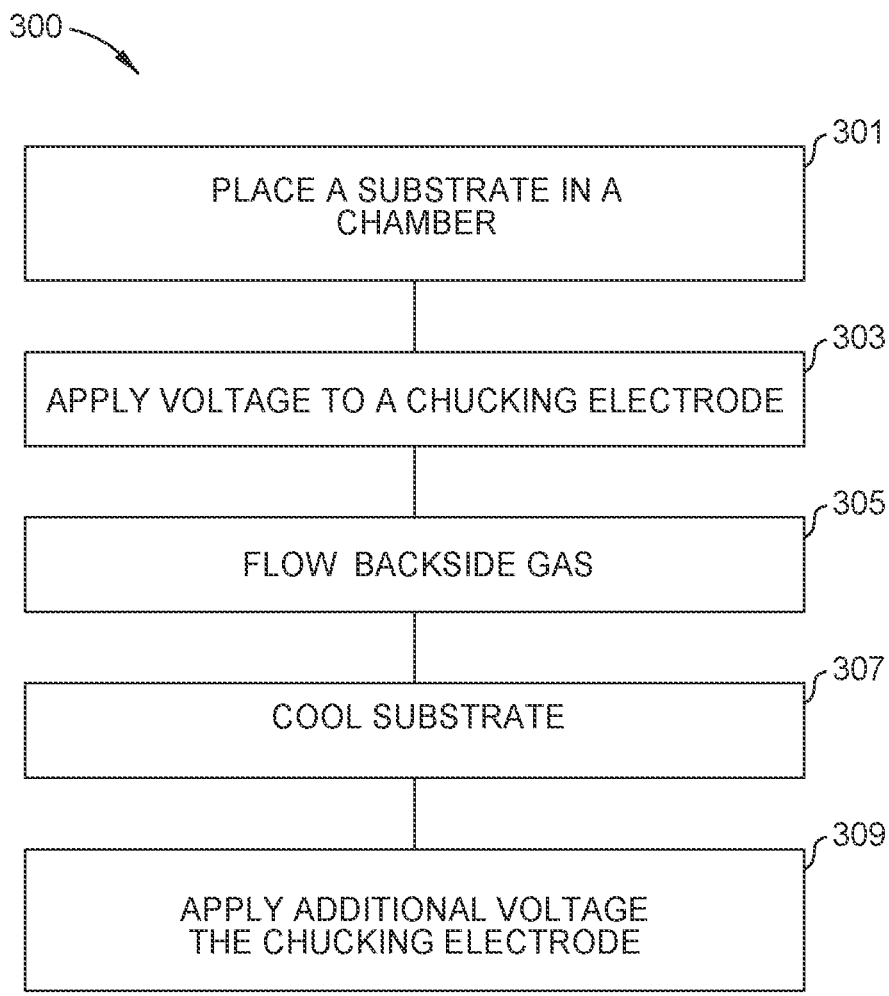
FIG. 3 illustrates a method of chucking a substrate.

FIG. 3 illustrates a chucking process 300 executed by the controller 138 for chucking the substrate 124 with a chucking electrode 126 within the ESC 103 (FIG. 1). The memory 138B includes instructions for carrying out and causing the process 300.

At operation 301, the substrate 124 is placed in the process chamber 100, onto the ESC 103. The process chamber 100 may be under vacuum. The ESC 103 has an ESC temperature below 0° C. For example, the temperature of the ESC 103 is less than −10° C. For example, the temperature of the ESC 103 is less than −50° C. For example, the temperature of the ESC 103 is between about −80° C. and about −100° C., for example, about −90° C.

At operation 303, the ESC 103 applies a first voltage to the chucking electrode 126. The first voltage is between about 700 V to about 900 V, for example 800 V. The first voltage applies a force to the substrate 124 by applying the voltage to the chucking electrode 126 (FIG. 2) within the ESC 103.

At operation 305, a backside gas is flowed to the substrate lower surface 203, at a first pressure from the ESC 103. The backside gas helps to equalize the temperature between the ESC 103 and the substrate 124. In some embodiments, the substrate 124 enters the chamber 100 at a substrate temperature of about 10° C. to about 40° C., for example about 15° C. to about 30° C., for example about 20° C. The backside gas flows into the cavity 205 (FIG. 2). The first pressure is between about 10 Torr and about 20 Torr, for example, about 12 Torr and about 16 Torr. The backside gas aids in equalizing the substrate temperature and ESC 103 temperature by increasing the transfer of thermal energy. In some embodiments, the backside gas is argon. In some embodiments, the backside gas is helium.

At operation 307 the ESC cools the substrate 124. The cooling is accomplished by the transmission of thermal energy through the backside gas from the substrate to the ESC 103. The substrate 124 is cooled to between about 10° C. and to about −100° C., for example the substrate is cooled from about 25° C. to −40° C. In some embodiments, the substrate is cooled from about −40° C. to about −90° C. in steps of 10° C. For example, −40° C. to −50° C. to −60° C. to −70° C. to −80° C. to −90° C. The chucking time interval is between about 20 to about 30 seconds. Operations 303, 305, and 307 occur within a chucking time interval. The operations may occur in the order as illustrated or may occur simultaneously. During the chucking time interval the substrate temperature is equalized to the ESC temperature. Equalized includes that the substrate temperature is less than 100° C. from the ESC temperature. Equalized includes that the substrate temperature is less than 10° C. from the ESC temperature. By allowing the substrate 124 to equalize at the first voltage and pressure, any flexing of the substrate occurs at a lower chucking force. The lower chucking force is less likely to damage the substrate 124 or generate particles from scratches.

At operation 309, a second voltage is applied to the chucking electrode 126 in the ESC 103. The second voltage is applied when the substrate temperature is less than 50° C. from the ESC temperature. For example, the second voltage is applied when the substrate is about the same temperature as the ESC. In some embodiments, the backside gas pressure is also increased to a second pressure higher than the first. The second voltage is applied after the chucking time interval. The second voltage is higher than the first voltage. In some embodiments, the second voltage is between about 1,800 V and about 2,200 V, for example 2,000 V. The second voltage is applied once the substrate temperature has equalized with that of the ESC. In some embodiments, the change from the first voltage to the second voltage can be a linear rate, continually increasing from the first voltage to the second voltage. In some embodiments, the second voltage is applied after about 25 seconds. The second pressure of the backside gas is between about 10 Torr and about 20 Torr, for example, about 12 Torr and about 16 Torr.

The process 300 may include additional intermediate operations such that the voltage is increased in three or more increments. For example, the process 300 may include four voltage increases. The voltage change between the first voltage and the second voltage can be a continuously varying voltage such that a linear slope (V/s) causes the voltage to ramp from the first voltage to the second voltage.

Figure 4:
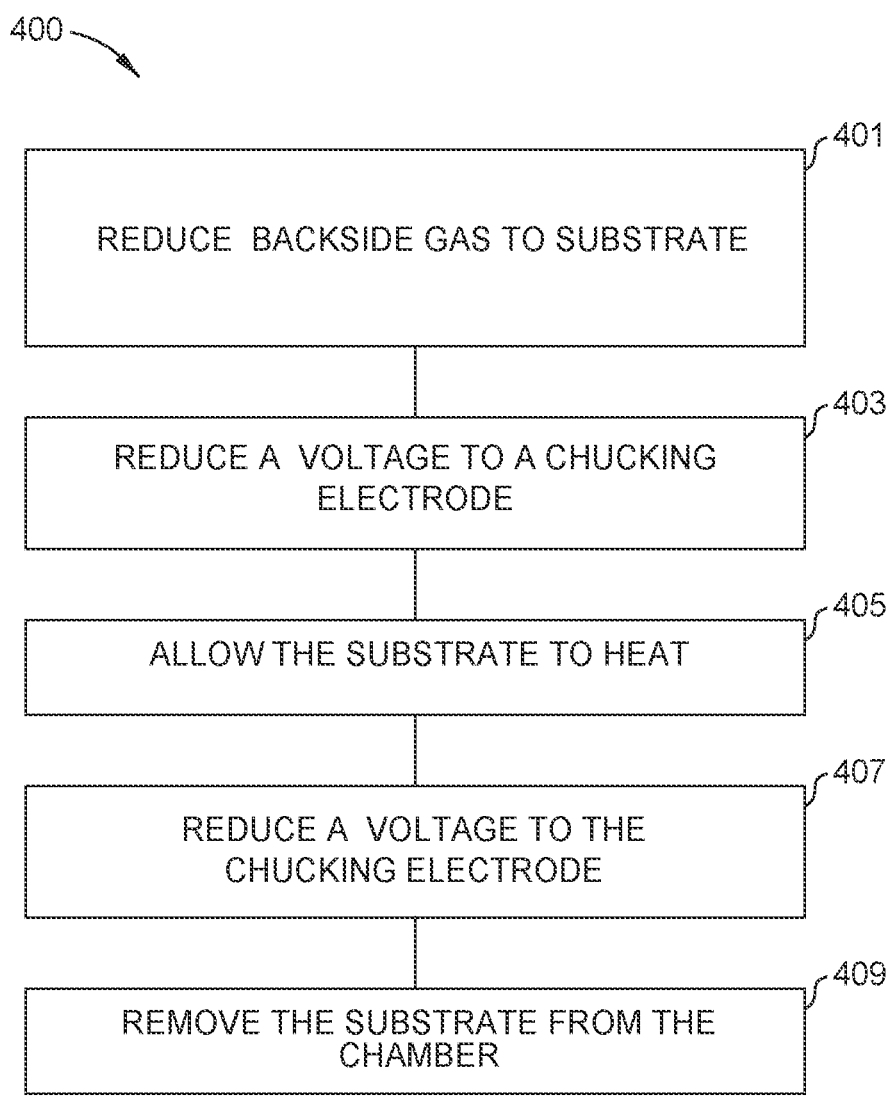
FIG. 4 illustrates a method of dechucking a substrate.

FIG. 4 illustrates a process 400 for dechucking the substrate 124 from the ESC 103. After processing the substrate 124, the process 400, which includes a two-stage soft dechucking process, is performed. The memory 138B includes instructions for carrying out and causing the process 400.

At operation 401, backside gas flow and/or pressure to the cavity 205 (FIG. 2) is reduced. In some embodiments, backside gas flow to the cavity 205 is stopped and or evacuated. In some embodiments the backside gas pressure is reduced from the second pressure to the first pressure previously discussed. Once the backside gas pressure is reduced, the rate of thermal energy transfer is decreased and the substrate temperature begins to increase.

At operation 403, the applied voltage is reduced. The applied voltage is between about 1,800 V to 2,200 V for example 2,000 V. The applied voltage is reduced to a dechucking voltage. The dechucking voltage is between about 700 V to about 900 V, for example 800 V. The dechucking voltage is applied by the chucking electrode 126 (FIG. 2) within the ESC 103.

At operation 405, the substrate 124 is allowed to equalize to an ambient chamber temperature for a dechucking interval. The dechucking interval is between about 10 seconds to about 40 seconds, for example about 12 seconds. In embodiments where the backside gas pressure is reduced, the backside gas pressure may be reduced during the dechucking interval. For example, when the substrate temperature reaches between about −30° C. to −50° C., the backside gas pressure is reduced from the second pressure to the first pressure. In some embodiments, the backside gas pressure is reduced from the second pressure to the first pressure in less time than the dechucking interval. In some embodiments, the applied voltage is reduced to the dechucking voltage at the end of the dechucking interval.

At operation 407, the backside gas pressure is further reduced from the first pressure to less than the first pressure. In some embodiments, the backside gas is stopped and or evacuated and no longer applies a force to the substrate.

At operation 409, the voltage is again reduced. In some embodiments, the voltage is reduced from the dechucking voltage to 0 V. In another embodiment, the voltage is reduced from the dechucking voltage to a non-zero voltage, for example, +/−200 V. In yet another embodiment, the voltage is reduced from the dechucking voltage to a non-zero voltage, for example, +−50 V to balance any residual charge on the wafer. After operation 409 the substrate no longer experiences a chucking force and can be removed from the process chamber.

As described above, by applying voltage to a chucking electrode while equalizing temperature and pressure, the damage to the substrate and generated contaminants can be reduced.

While the foregoing is directed to examples of the present disclosure, other and further examples of the disclosure may be devised without departing from the basic scope thereof.

What is claimed is:

1. A method of chucking a substrate to a surface of an electrostatic chuck (ESC) in a processing chamber, the method comprising:
   applying a first voltage to a chucking electrode in the ESC during a chucking time interval;
   supplying an inert gas at a first pressure to a backside of the substrate during the chucking time interval;
   equalizing a substrate temperature and an ESC temperature such that the substrate temperature and the ESC temperature are less than about 50° C. apart;
   applying a second voltage to the chucking electrode after the equalizing the substrate temperature and the ESC temperature, the second voltage being higher than the first voltage; and
   supplying the inert gas at a second pressure to the backside of the substrate after the chucking time interval, the second pressure being higher than the first pressure of the inert gas.

2. The method of claim 1, wherein the inert gas is argon.

3. The method of claim 1, wherein the substrate temperature decreases during the chucking time interval.

4. The method of claim 1, wherein the first voltage is between about 700 V and about 900 V.

5. The method of claim 1, wherein the second voltage is between about 1900 V and about 2100 V.

6. The method of claim 1, wherein the chucking time interval is between about 20 seconds and about 30 seconds.

7. The method of claim 1, further comprising cooling the substrate to a first temperature during the chucking time interval.

8. The method of claim 1, further comprising equalizing the substrate temperature and the ESC temperature during the chucking time interval.

9. The method of claim 1, wherein the ESC is at a temperature less than the temperature of the substrate.

10. A method of dechucking a substrate from a surface of an electrostatic chuck (ESC) in a processing chamber, the method comprising:
    reducing a backside gas pressure at a lower surface of a substrate;
    reducing an applied voltage to a chucking electrode in the ESC to a dechucking voltage after reducing the backside gas pressure;
    increasing a substrate temperature for a dechucking interval while holding the substrate at the dechucking voltage;
    reducing backside gas pressure after the dechucking interval; and
    reducing the dechucking voltage.

11. The method of claim 10, wherein the ESC has an ESC temperature that is maintained at a temperature less than −10° C.

12. The method of claim 10, wherein the dechucking interval is between about 10 seconds and about 40 seconds.

13. The method of claim 10, wherein reducing the applied voltage to the dechucking voltage comprises reducing the applied voltage from between about 1900 V and about 2100 V to between about 700 V and about 900 V.

14. A substrate processing chamber comprising:
an electrostatic chuck (ESC) in fluid communication with a cryogenic chiller; and
a controller comprising a central processing unit (CPU), support circuits, and a non-transitory computer readable medium comprising instructions for chucking a substrate that, when executed, cause:
 a first voltage to be applied to a chucking electrode in the ESC for a first time interval;
 a first pressure of inert gas to be applied to a backside of the substrate for the first time interval, the first time interval configured to equalize a substrate temperature and an ESC temperature such that the substrate temperature and the ESC temperature are less than about 50° C. apart;
 a second voltage to be applied to the chucking electrode for a second time interval after the first time interval, the second voltage being higher than the first voltage; and
 a second pressure of inert gas to be applied to the backside of the substrate for the second time interval, the second pressure of inert gas being higher than the first pressure of inert gas.

15. The substrate processing chamber of claim 14, wherein the instructions further cause:
 a backside gas pressure to be reduced at a lower surface of a substrate;
 an applied voltage to the chucking electrode to be reduced to a dechucking voltage after reducing the pressure;
 the substrate to be allowed to increase in temperature for a dechucking interval;
 backside gas pressure to be reduced after the dechucking interval; and
 the dechucking voltage to be reduced after the dechucking interval.

16. The substrate processing chamber of claim 15, wherein the inert gas is argon.

17. The substrate processing chamber of claim 14, wherein the first voltage is between about 700 V and about 900 V.

18. The substrate processing chamber of claim 14, wherein the first time interval is between about 20 seconds and about 40 seconds.

19. The substrate processing chamber of claim 14, wherein the second time interval is greater than two seconds.

* * * * *